United States Patent

Takigami

[19]

[11] Patent Number: 6,113,999
[45] Date of Patent: Sep. 5, 2000

[54] MULTILAYERED SUBSTRATE AND METHOD FOR ITS PRODUCTION

[75] Inventor: Kotaro Takigami, Asaka, Japan

[73] Assignee: Fuji Photo Film Co. Ltd., Kanagawa, Japan

[21] Appl. No.: 09/397,875

[22] Filed: Sep. 17, 1999

Related U.S. Application Data

[62] Division of application No. 09/103,507, Jun. 24, 1998, Pat. No. 6,007,886.

[30] Foreign Application Priority Data

Jun. 27, 1997 [JP] Japan .................................. 9-171570

[51] Int. Cl.⁷ ....................................................... B32B 3/10
[52] U.S. Cl. ........................... 428/43; 428/136; 428/137; 156/252; 156/253
[58] Field of Search ........................... 428/43, 137, 136; 156/252, 253; 242/159

[56] References Cited

U.S. PATENT DOCUMENTS

| | | |
|---|---|---|
| 3,823,057 | 7/1974 | Roberts et al. ............................ 428/43 |
| 4,368,903 | 1/1983 | Jones ......................................... 428/43 |
| 5,789,050 | 8/1998 | Kang ......................................... 428/43 |

*Primary Examiner*—Alexander S. Thomas

[57] ABSTRACT

A multilayered substrate divisible into a plurality of parts at predetermined positions of division is configured such that intermittently formed perforation-like holes or slit-like holes are present at the positions of division of a core layer. Further, V-cut V-grooves are present at the positions of division of surface layers. The multilayered substrate, divisible at predetermined positions of division, is also configured such that first intermittently formed holes (perforation-like holes, slit-like holes, or widely spaced holes) are present at the positions of division of the core layer. Further, second intermittently formed holes (perforation-like holes, or slit-like holes) are present at the positions of division of the surface layers so as to pass through the multilayered substrate. At the positions of division of the core layer, each of the second holes is located between the adjacent first holes, whereby the first holes and the second holes are continuous with each other. Methods for production of these multilayered substrates are also disclosed.

8 Claims, 6 Drawing Sheets

27 SLIT-LIKE HOLES

MULTILAYERED SUBSTRATE 31
PERFORATION-LIKE HOLES 35
32 SURFACE LAYERS
33 CORE LAYER
36 PERFORATION-LIKE HOLES

FIG.3B

ADHESIVE 34

FIG. 4A

SLIT-LIKE HOLES

MULTILAYERED SUBSTRATE AND METHOD FOR ITS PRODUCTION

This application is a divisional of application Ser. No. 09/103,507, filed on Jun. 24, 1998, U.S. Pat. No. 6,007,886 the entire contents of which are hereby incorporated by reference.

BACKGROUND OF THE INVENTION

1. Field of the Invention

This invention relates to a multilayered substrate and a method for its production. More particularly, the invention relates to a multilayered substrate having a core layer of a strong, hard-to-break material, but divisible into a plurality of parts, and a method useful for its production.

2. Description of the Prior Art

Figure 5A:
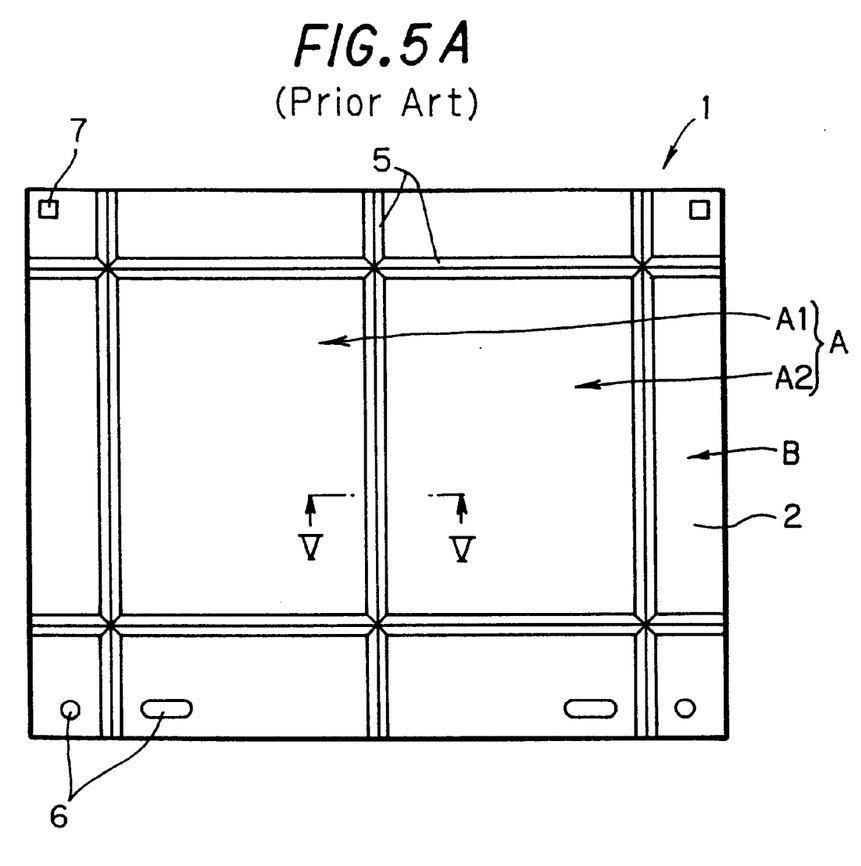
Figure 5B:
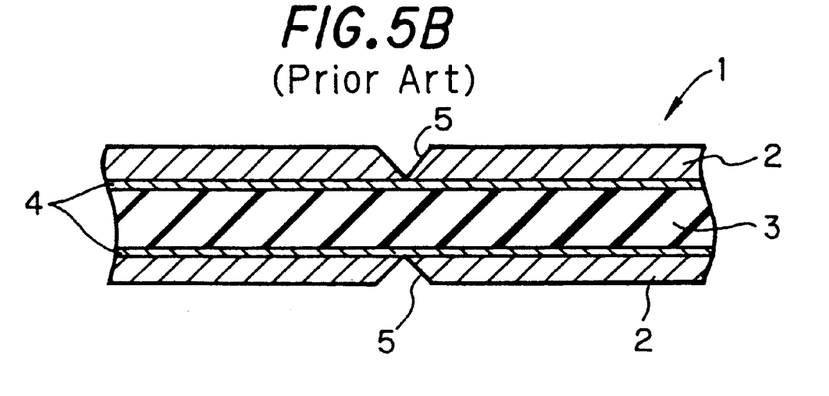
FIG. 5B is an enlarged sectional view taken along line V—V of FIG. 5A.

FIG. 5A is a plan view showing an example of a conventional multilayered substrate, and FIG. 5B is an enlarged sectional view taken along line V—V of FIG. 5A.

As shown in FIGS. 5A and 5B, a multilayered substrate 1 comprises a surface layer 2 laminated on each surface of a core layer 3 by the use of an adhesive (prepreg agent) 4. Between the core layer 3 and the surface layer 2, there is a printed wiring inner layer pattern (not shown). On the surface layer 2, there are a printed wiring superficial layer pattern (not shown), and various packaged electronic parts (not shown).

For the core layer 3, a plate comprising a glass fiber-woven cloth, as a core, hardened with an epoxy resin or the like is used to impart required strength to the multilayered substrate 1. The surface layer 2 which does not require marked strength, on the other hand, uses a thin plate comprising a cloth of glass fibers (a woven cloth), as a core, hardened with an epoxy resin or the like.

To divide the multilayered substrate 1 into a plurality of parts at predetermined positions of division, a plurality of V-grooves (grooves each with a V-shaped cross section) 5 formed by longitudinal and transverse linear V-cutting are present at the positions of division. In the illustrated example, the multilayered substrate 1 is severed along the V-grooves 5 to form body substrate portions A with packaged electronic parts, extra substrate portions B which have mounter basic holes 6 serving as references for packaging of electronic parts, and recognition marks 7 for setting a reference position for positioning during pattern formation. The body substrate portion A is further divided into a first body substrate portion A1 and a second body substrate portion A2.

Figure 6A:
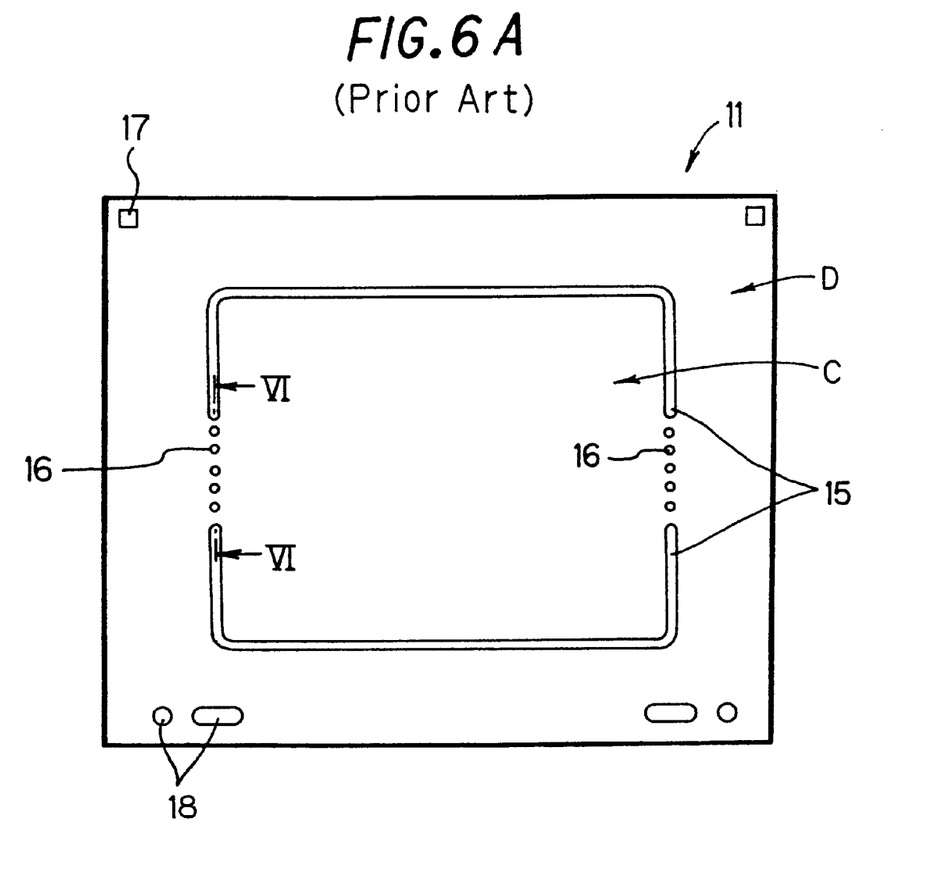
Figure 6B:
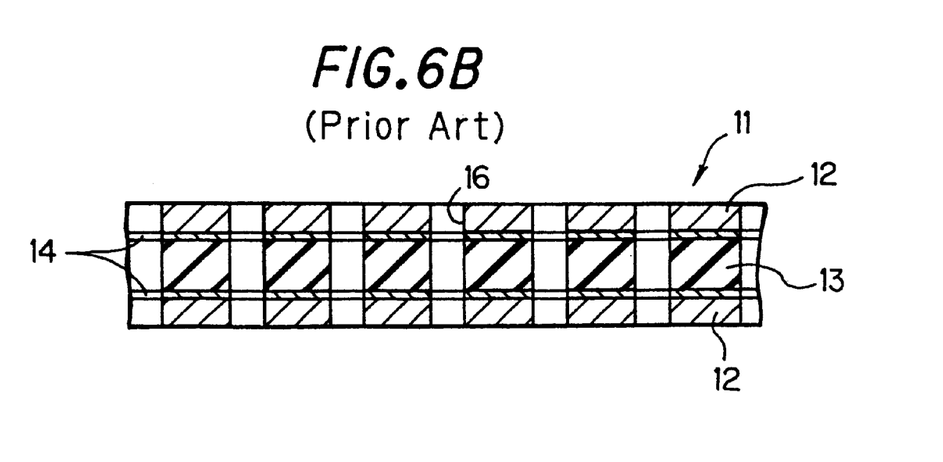
FIG. 6B is an enlarged sectional view taken along line VI—VI of FIG. 6A.

FIG. 6A is a plan view showing another example of a conventional multilayered substrate. FIG. 6B is an enlarged sectional view taken along line VI—VI of FIG. 6A.

As shown in FIGS. 6A and 6B, a multilayered substrate 11 comprises a surface layer 12 laminated on each surface of a core layer 13 by the use of an adhesive (prepreg agent) 14. Between the core layer 13 and the surface layer 12, there is a printed wiring inner layer pattern (not shown). On the surface layer 12, there are a printed wiring superficial layer pattern (not shown), and various packaged electronic parts (not shown).

For the core layer 13, a plate comprising a glass fiber-woven cloth, as a core, hardened with an epoxy resin or the like is used to impart required strength to the multilayered substrate 11. The surface layer 2 which does not require marked strength, on the other hand, uses a thin plate comprising a cloth of glass fibers (a woven cloth), as a core, hardened with an epoxy resin or the like.

To divide the multilayered substrate 11 into a plurality of parts at predetermined positions of division, slits 15 formed at spaced locations, and perforation-like holes 16 formed intermittently between the slits 15 and passing through the multilayered substrate 11 are present at the positions of division. In the illustrated example, the multilayered substrate 11 is severed along the slits 15 and the perforation-like holes 16 to form a body substrate portion C with packaged electronic parts. An extra substrate portion D is also formed, which has mounter basic holes 18 serving as references for packaging of electronic parts, and recognition marks 17 for setting a reference position for positioning during pattern formation. In the portion where the slits 15 are formed, perforation-like holes 16 may be formed instead of the slits 15.

With the above-described conventional multilayered substrates 1, 11, however, the core layers 3, 13 are made of a strong, hard-to-break material comprising a glass fiber-woven cloth as a core. Thus, the core layers 3, 13 do not easily break even when an operator tries to sever them by means of a simplified mold, or when an operator tries to divide them manually. Consequently, a dividing operation has been difficult. The surface layers 2, 12 are also made of a material comprising a glass fiber-woven cloth as a core, but can be easily divided, because they are thin.

SUMMARY OF THE INVENTION

The present invention has been accomplished in light of the foregoing problem with the earlier technologies. An object of this invention is to provide a multilayered substrate, and a method for its production. The multilayered substrate is easily divisible into a plurality of parts even when its core layer is made of a strong, hard-to-break material, such as a glass fiber-woven cloth, as a core, hardened with an epoxy resin or the like.

According to a first aspect of the present invention, there is provided a multilayered substrate for attaining the above-described object, which comprises surface layers laminated on a core layer and which is divisible into a plurality of parts at predetermined positions of division, wherein intermittently formed holes are present at the positions of division of the core layer, and cut grooves are present at the positions of division of the surface layers.

According to a second aspect of the invention, there is provided a method for production of the above multilayered substrate comprising surface layers laminated on a core layer and being divisible into a plurality of parts at predetermined positions of division, the method comprising:

forming intermittent holes at the positions of division of the core layer;

laminating the surface layers on the core layer; and cutting the surface layers at the positions of division to form grooves.

According to a third aspect of the invention, there is provided a multilayered substrate for attaining the above-described object, which comprises surface layers laminated on a core layer and which is divisible into a plurality of parts at predetermined positions of division, wherein first intermittently formed holes are present at the positions of division of the core layer, and second intermittently formed holes are present at the positions of division of the surface layers so as to pass through the multilayered substrate, and at the positions of division of the core layer, each of the second holes is located between the adjacent first holes, whereby the first holes and the second holes are continuous with each other.

According to a fourth aspect of the invention, there is provided a method for production of the above multilayered substrate comprising surface layers laminated on a core layer and being divisible into a plurality of parts at predetermined positions of division, the method comprising:

forming first intermittent holes at the positions of division of the core layer;

laminating the surface layers on the core layer; and further forming second intermittent holes at the positions of division of the surface layers so as to pass through the multilayered substrate, with each of the second holes being located between the adjacent first holes at the positions of division of the core layer, whereby the first holes and the second holes are made continuous with each other.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood by the accompanying drawings which are given by way of illustration only, and thus are not limitative of the present invention, and wherein:

FIG. 1A is a partly cutaway plan view showing a multilayered substrate according to Embodiment 1 of the present invention, while

FIG. 2A is a partly cutaway plan view showing another multilayered substrate according to Embodiment 1 of the present invention, while

FIG. 3A is a partly cutaway plan view showing a multilayered substrate according to Embodiment 2 of the present invention, while

FIG. 4A is a partly cutaway plan view showing another multilayered substrate according to Embodiment 2 of the present invention, while

FIG. 5A is a plan view showing an example of a conventional multilayered substrate, while FIG. 6A is a plan view showing another example of a conventional multilayered substrate, while

DETAILED DESCRIPTION OF THE PREFERRED EMBODIMENTS

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Embodiments of the present invention will now be described in detail with reference to the accompanying drawings. This invention relates to the structure, at positions of division, of a multilayered substrate. Hereinafter, this structure of the multilayered substrate at the positions of division will be described in detail. Since other constructions of the multilayered substrate are similar to conventional multilayered substrates (e.g., those shown in FIGS. 5A and 6A), detailed descriptions and illustrations for them will be omitted.

<EMBODIMENT 1>

Figure 1A:
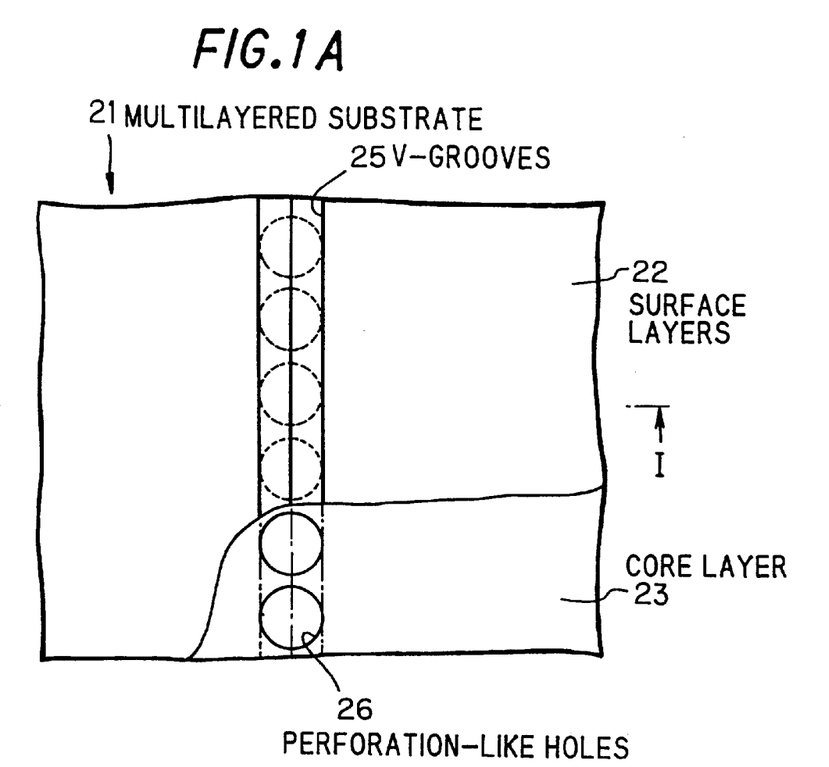
Figure 1B:
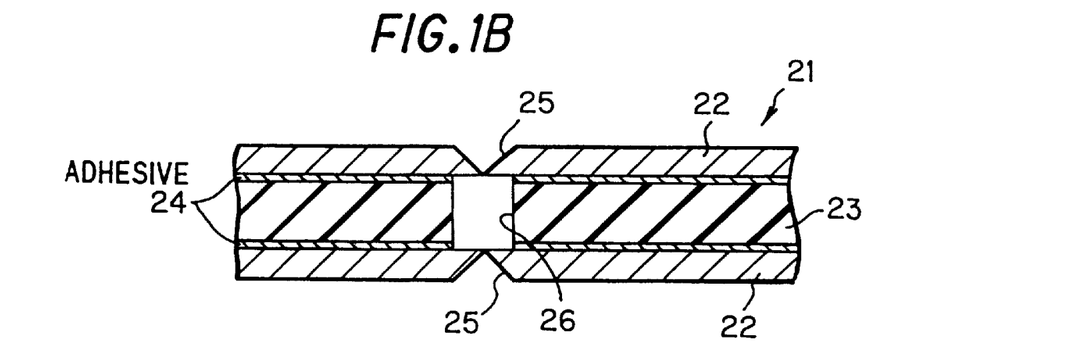
FIG. 1B is a sectional view taken on line I—I of FIG. 1A.
Figure 2A:
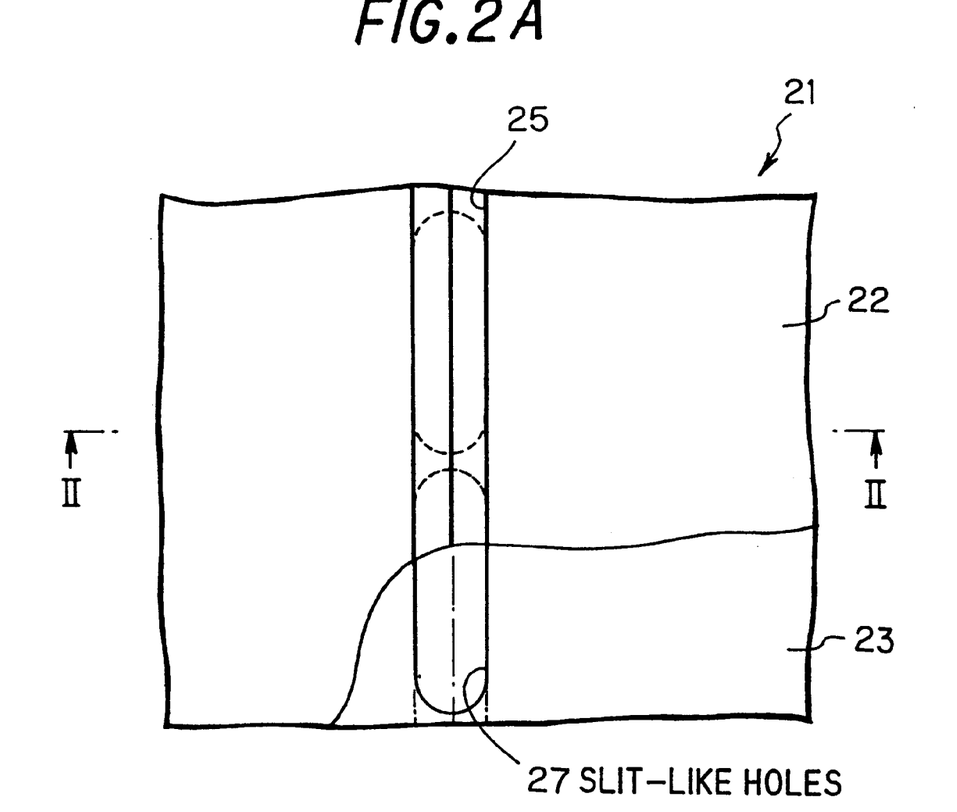
Figure 2B:
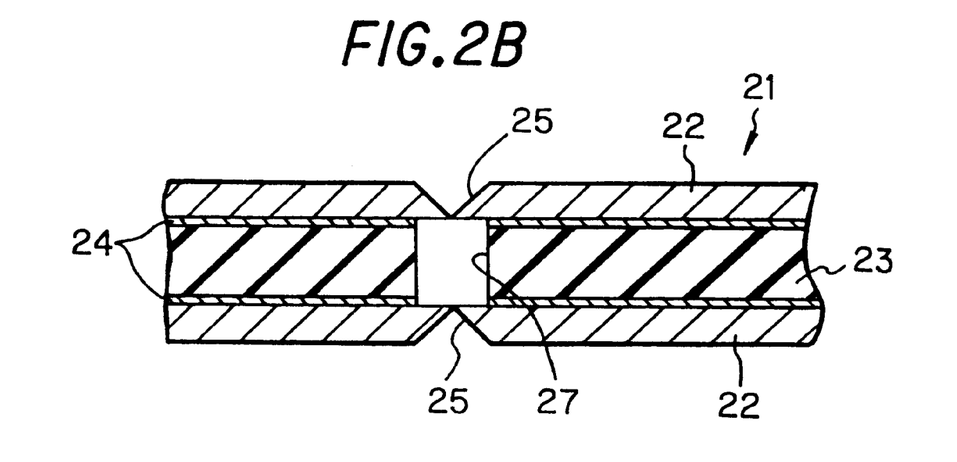
FIG. 2B is a sectional view taken on line II—II of FIG. 2A.

FIG. 1A is a partly cutaway plan view showing a multilayered substrate according to Embodiment 1 of the present invention. FIG. 1B is a sectional view taken on line I—I of FIG. 1A. FIG. 2A is a partly cutaway plan view showing another multilayered substrate according to Embodiment 1 of the present invention. FIG. 2B is a sectional view taken on line II—II of FIG. 2A.

As shown in FIGS. 1A and 1B, a multilayered substrate 21 comprises a surface layer 22 laminated on each surface of a core layer 23 by the use of an adhesive (prepreg agent) 24. Between the core layer 23 and the surface layer 22, there is a printed wiring inner layer pattern (not shown). On the surface layer 22, there are a printed wiring superficial layer pattern (not shown), and various packaged electronic parts (not shown).

For the core layer 23, a plate comprising a glass fiber-woven cloth, as a core, hardened with an epoxy resin or the like is used to impart required strength to the multilayered substrate 21. The surface layer 22 which does not require marked strength, on the other hand, uses a thin plate comprising a cloth of glass fibers (a woven cloth), as a core, hardened with an epoxy resin or the like.

To divide the multilayered substrate 21 into a plurality of parts at predetermined positions of division, intermittently formed perforation-like holes 26 are present at the positions of division of the core layer 23, and V-grooves (grooves each with a V-shaped cross section) 25 formed by linear V-cutting are present at the positions of division of the surface layers 22.

In the core layer 23 of the multilayered substrate 21, slit-like holes 27 may be formed intermittently instead of the perforation-like holes 26, as shown in FIGS. 2A and 2B.

The multilayered substrate 21 of the foregoing configuration can be produced in the following manner:

At the positions of division of the core layer 23, intermittent perforation-like holes 26 or slit-like holes 27 are formed by means of a drill or the like. Then, the surface layers 22 are laminated on both surfaces of the core layer 23 by adhesion with the adhesive 24. These surface layers 22 are V-cut to form V-grooves 25. In this manner, the multilayered substrate 21 is produced.

According to the multilayered substrate 21 and the method for its production according to the instant Embodiment 1, therefore, the V-cut V-grooves 24 are present in the surface layers 22, and the intermittently formed perforation-like holes 26 or slit-like holes 27 are present in the core layer 23. Thus, even when the core layer 23 is made of a strong, hard-to-break material comprising a glass fiber-woven cloth, as a core, hardened with an epoxy resin or the like, the multilayered substrate 21 having the core layer 23 can easily be severed by means of a simplified mold, or divided manually to separate it into a plurality of parts.

<EMBODIMENT 2>

Figure 3A:
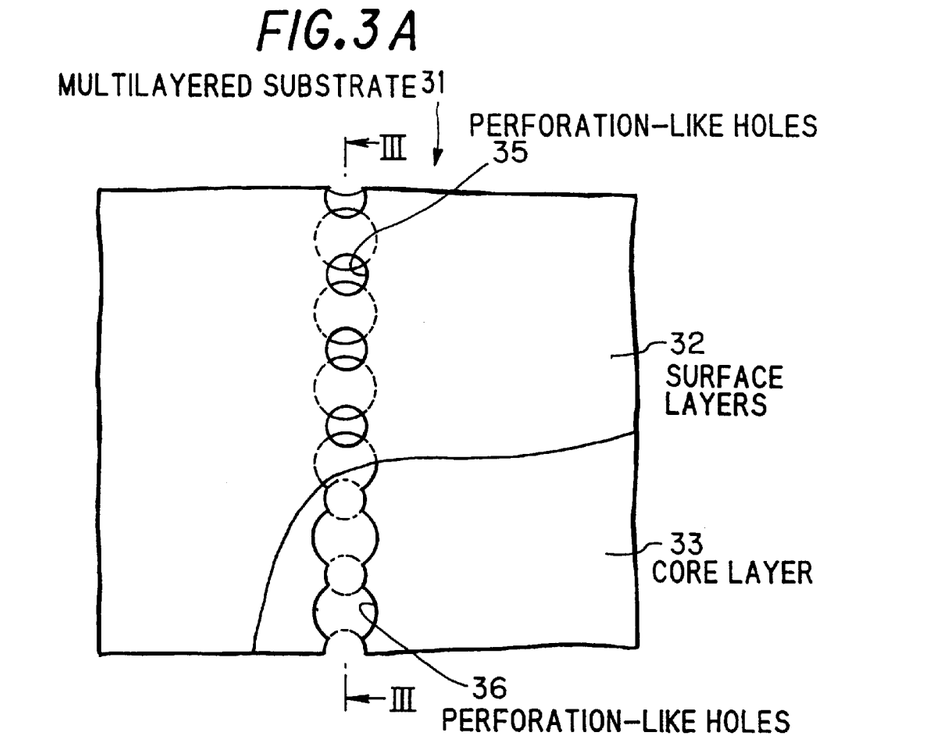
Figure 3B:
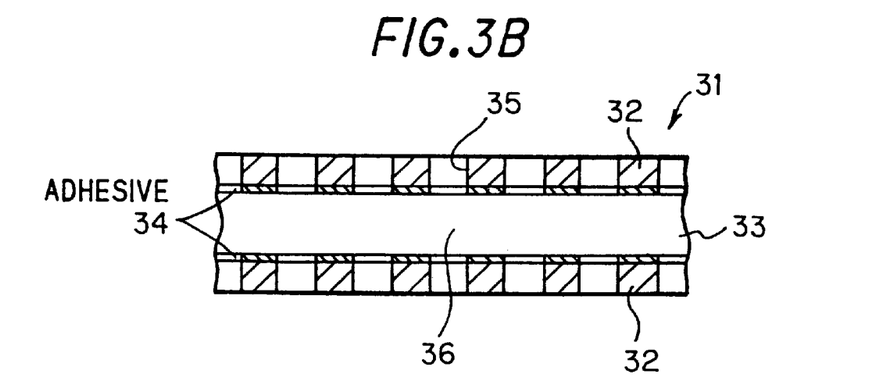
FIG. 3B is a sectional view taken on line III—III of FIG. 3A.
Figure 4A:
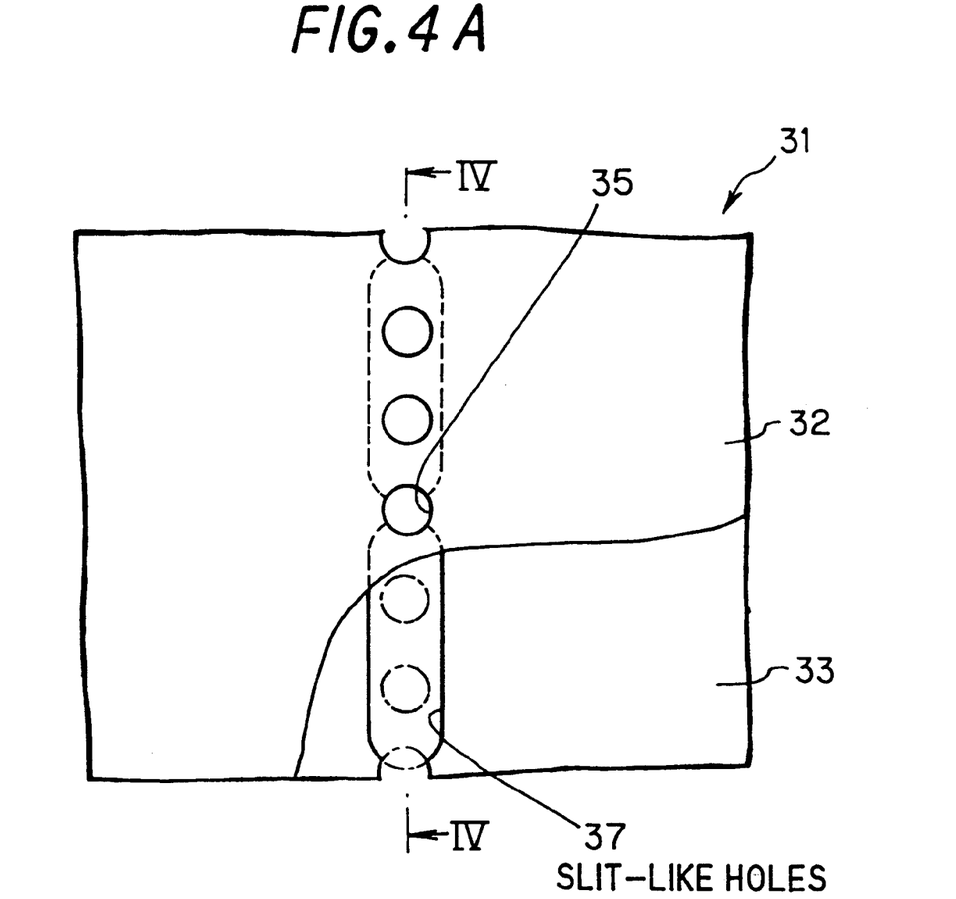
Figure 4B:
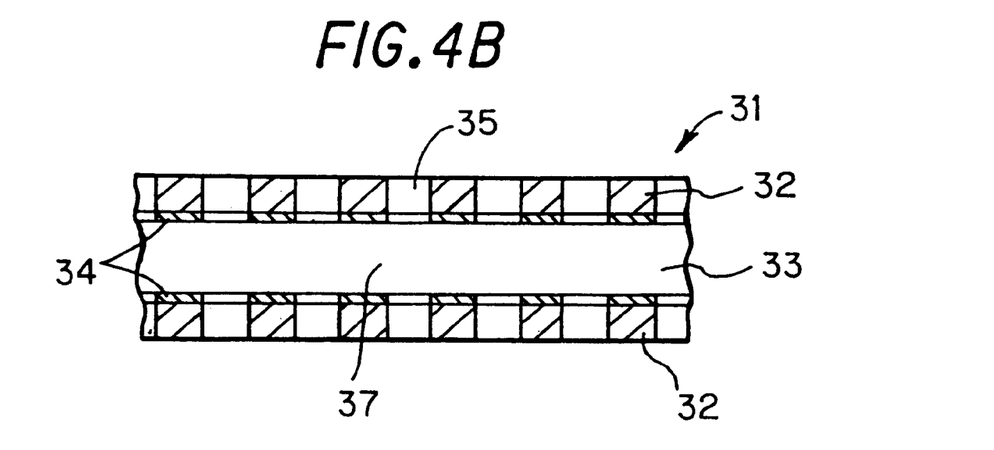
FIG. 4B is a sectional view taken on line IV—IV of FIG. 4A.

FIG. 3A is a partly cutaway plan view showing a multilayered substrate according to Embodiment 2 of the present invention. FIG. 3B is a sectional view taken on line III—III of FIG. 3A. FIG. 4A is a partly cutaway plan view showing another multilayered substrate according to Embodiment 2 of the present invention. FIG. 4B is a sectional view taken on line IV—IV of FIG. 4A.

As shown in FIGS. 3A and 3B, a multilayered substrate 31 comprises a surface layer 32 laminated on each surface of a core layer 33 by the use of an adhesive (prepreg agent) 34. Between the core layer 33 and the surface layer 32, there is a printed wiring inner layer pattern (not shown). On the surface layer 32, there are a printed wiring superficial layer pattern (not shown), and various packaged electronic parts (not shown).

For the core layer 33, a plate comprising a glass fiber-woven cloth, as a core, hardened with an epoxy resin or the like is used to impart required strength to the multilayered substrate 31. The surface layer 32 which does not require marked strength, on the other hand, uses a thin plate comprising a cloth of glass fibers (a woven cloth), as a core, hardened with an epoxy resin or the like.

To divide the multilayered substrate 31 into a plurality of parts at predetermined positions of division, first intermittently formed perforation-like holes 36 are present at the positions of division of the core layer 33, and second intermittently formed perforation-like holes 35 are present at the positions of division of the surface layers 32 so as to pass through the multilayered substrate 31. At the positions of division of the core layer 33, each of the second perforation-like holes 35 is located between the adjacent first perforation-like holes 36, so that the first perforation-like holes 36 and the second perforation-like holes 35 are continuous with each other.

In the core layer 33 of the multilayered substrate 31, as shown in FIGS. 4A and 4B, slit-like holes 37 may be formed intermittently instead of the perforation-like holes 36, and each of the second perforation-like holes 35 may be located between the adjacent slit-like holes 37.

Alternatively, it is permissible, although not shown, to form widely spaced holes at the positions of division of the core layer 33, and to form slit-like holes intermittently at the positions of division of the surface layers 32 so as to pass through the multilayered substrate 31. At the positions of division of the core layer 33, moreover, each of these slit-like holes may be located between the adjacent widely spaced holes, so that the widely spaced holes and the slit-like holes are continuous with each other.

The multilayered substrate 31 of the foregoing configuration can be produced in the following manner:

At the positions of division of the core layer 33, the first intermittent perforation-like holes 36, slit-like holes 37, or widely spaced holes are formed by means of a drill or the like. Then, the surface layers 32 are laminated on both surfaces of the core layer 33 by adhesion with the adhesive 34. At the positions of division of the surface layers 32, the second perforation-like holes 35 or slit-like holes are formed intermittently by means of a drill or the like so as to pass through the multilayered substrate 31. In this case, at the positions of division of the core layer 33, each of the second perforation-like holes 35 is located between the adjacent first perforation-like holes 36 or slit-like holes 37, whereby the first perforation-like holes 36 or slit-like holes 37 are made continuous with the second perforation-like holes 35. Alternatively, each of the slit-like holes is located between the adjacent widely spaced holes, whereby the widely spaced holes and the slit-like holes are made continuous with each other. In this manner, the multilayered substrate 31 is produced.

Positioning of each second perforation-like hole 35 between the adjacent first perforation-like holes 36 or slit-like holes 37, or positioning of each slit-like hole between the adjacent widely spaced holes can be easily performed by setting the positions of the respective holes by use of a pattern. This can be done in the same manner as in the formation of a printed wiring pattern.

According to the multilayered substrate 31 and the method for its production according to the instant Embodiment 2, therefore, the second intermittently formed perforation-like holes 35 or slit-like holes are present in the surface layers 32, and the first intermittently formed perforation-like holes 36 or slit-like holes 37 are continuous with the second intermittently formed perforation-like holes 35 in the core layer 33, or the widely spaced holes and the slit-like holes are continuous with each other in the core layer 33. Thus, even when the core layer 33 is made of a strong, hard-to-break material comprising a glass fiber-woven cloth, as a core, hardened with an epoxy resin or the like, the multilayered substrate 31 having the core layer 33 can easily be severed by means of a simplified mold, or divided manually to separate it into a plurality of parts.

The above Embodiments 1 and 2 have been described with the glass fiber-based multilayered substrate being taken as an example. However, the present invention is not restricted thereto, but can also be applied to a multilayered substrate based on fibers other than glass fibers.

These Embodiments 1 and 2 have also been described while taking as an example the multilayered substrate comprising a plate material as a core layer, and plate materials as surface layers laminated onto the core layer by adhesion with an adhesive. However, the present invention is not restricted thereto, but can also be applied to a multilayered substrate comprising a laminate formed by printing (a so-called built-up substrate).

According to the multilayered substrates and the methods for their production of the present invention, as concretely explained along with the embodiments, the cut grooves are present in the surface layers, and the intermittently formed holes (perforation-like holes or slit-like holes) are present in the core layer. Thus, even when the core layer is made of a strong, hard-to-break material comprising, for example, a glass fiber-woven cloth, as a core, hardened with an epoxy resin or the like, the multilayered substrate having the core layer can easily be severed by means of a simplified mold, or divided manually to separate it into a plurality of parts.

Furthermore, the second intermittently formed holes (perforation-like holes or slit-like holes) are present in the surface layers, and the first intermittently formed holes (perforation-like holes, slit-like holes, or widely spaced holes) and the second intermittently formed holes each located between the first intermittently formed holes are continuous with each other in the core layer. Thus, even when the core layer is made of a strong, hard-to-break material comprising a glass fiber-woven cloth, as a core, hardened with an epoxy resin or the like, the multilayered substrate having the core layer can easily be severed by means of a simplified mold, or divided manually to separate it into a plurality of parts.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A multilayered substrate, comprising a core layer; and surface layers laminated on the core layer, the surface layers being divisible into a plurality of parts at predetermined positions of division, wherein the core layer includes first intermittently formed holes at the positions of division of the core layer, and the surface layers include second intermittently formed holes at the positions of division of the surface layers so as to pass through the multilayered substrate, and each of the second holes is located between adjacent first holes at the position of division of the core layer, whereby the first holes and the second holes are continuous with each other.

2. The multilayered substrate of claim 1, wherein the first holes are relatively larger than the second holes.

3. The multilayered substrate of claim 1, wherein the core layer includes a glass fiber woven cloth.

4. The multilayered substrate of claim 1, wherein each first hole partially overlaps at least one second hole.

5. A method of production of a multilayered substrate including surface layers laminated on a core layer and being divisible into a plurality of parts at predetermined positions of division, said method comprising:

forming first intermittent holes at the positions of division of the core layer;

laminating the surface layers on the core layer; and forming second intermittent holes at the positions of division of the surface layers so as to pass through the multilayered substrate, with each of the second holes being located between adjacent first holes at the positions of division of the core layer, whereby the first holes and the second holes are made continuous with each other.

6. The method of claim 5, wherein the first holes are relatively larger than the second holes.

7. The method of claim 5, wherein the core layer includes a glass fiber woven cloth.

8. The method of claim 5, wherein each first hole partially overlaps at least one second hole.

* * * * *